US011177796B2

United States Patent
Kurylak et al.

(10) Patent No.: US 11,177,796 B2
(45) Date of Patent: Nov. 16, 2021

(54) SENSE AMPLIFIER FLIP-FLOP

(71) Applicant: Cisco Technology, Inc., San Jose, CA (US)

(72) Inventors: Alexander C. Kurylak, Bethlehem, PA (US); Kadaba Lakshmikumar, Basking Ridge, NJ (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/841,593

(22) Filed: Apr. 6, 2020

(65) Prior Publication Data
US 2021/0313971 A1   Oct. 7, 2021

(51) Int. Cl.
*H03K 3/037* (2006.01)
*H03K 3/287* (2006.01)
(Continued)

(52) U.S. Cl.
CPC ............. *H03K 3/287* (2013.01); *H03K 3/037* (2013.01); *H03K 3/288* (2013.01); *H03K 3/356* (2013.01); *H03K 3/35613* (2013.01)

(58) Field of Classification Search
CPC ............. H03K 3/0233; H03K 3/02332; H03K 3/02335; H03K 3/027; H03K 3/037; H03K 3/0372; H03K 3/0375; H03K 3/286; H03K 3/287; H03K 3/288; H03K 3/2885; H03K 3/289; H03K 3/356; H03K 3/356017; H03K 3/356034; H03K 3/356052;
(Continued)

(56) References Cited

U.S. PATENT DOCUMENTS 6,310,501 B1   10/2001  Yamashita
2008/0180139 A1*  7/2008  Natonio ............. H03K 3/35625
                                                              327/218
(Continued)

FOREIGN PATENT DOCUMENTS

CN          102339637 B       7/2014

OTHER PUBLICATIONS

J.C. Kim, Y.C. Jang, and H.J. Park, "CMOS Sense Amplifier-based Flip-Flop with two N-C/sup 2.MOS Output Latches" Electron. Lett., vol. 36, No. 6, 498-500, Mar. 2000 [Abstract Only].
(Continued)

*Primary Examiner* — Long Nguyen
(74) *Attorney, Agent, or Firm* — Patterson + Sheridan, LLP

(57) ABSTRACT

A flip-flop is provided that includes an input latch, configured to receive a data signal and a complement and produce set and reset pulses based on a clock and a difference between the data signal and the complement; and an output latch, configured to store a data value in a first memory and a complement data value in a second memory based on the set and reset pulses and the clock. Various buffers configured to invert and amplify the set and reset pulses before provision to the output latch stages are optionally disposed between the input and output latches. The input latch includes two signal arms, two difference transistors (one gate controlled by the clock and the other by a clock complement) coupled oppositely to one another (by respective drains and sources) to the signal arms, and two regeneration inverters coupled oppositely to one another to the signal arms.

17 Claims, 6 Drawing Sheets

(51) Int. Cl.
*H03K 3/288* (2006.01)
*H03K 3/356* (2006.01)

(58) Field of Classification Search
CPC ....... H03K 3/356069; H03K 3/356104; H03K 3/356113; H03K 3/35613; H03K 3/3562; H03K 3/35625
See application file for complete search history.

(56) References Cited

U.S. PATENT DOCUMENTS

2009/0108885 A1* 4/2009 Natonio ............. H03K 3/35625
327/215
2015/0155857 A1 6/2015 Byeon

OTHER PUBLICATIONS

F. Kobayashi, K. Nogami, T. Shirotori, Y. Fujimoto and O. Watanabe, "A current-mode latch sense amplifier and a static power saving input buffer for low-power architecture," 1992 Symposium on VLSI Circuits Digest of Technical Papers, Seattle, WA, USA, 1992, pp. 28-29 [Abstract Only].
PCT Invitation to Pay Additional Fees and, Where Applicable, Protest Fees for Application No. PCT/US2021/070322 dated Jul. 8, 2021.
PCT Notification of Transmittal of The International Search Report and The Written Opinion of The International Searching Authority, or The Declaration for Application PCT/US2021/070322, dated Aug. 30, 2021.

* cited by examiner

SENSE AMPLIFIER FLIP-FLOP

TECHNICAL FIELD

Embodiments presented in this disclosure generally relate to sense amplifier flip-flop (SAFF) circuits. More specifically, embodiments disclosed herein provide an architecture for a sense amplifier flip-flop using pseudo-differential inverters and that operates in a class-AB mode.

BACKGROUND

Digital systems use various timing devices such as latches and flip-flops in signal processing that have various operational characteristics. These operation characteristics depend on the types and arrangement of the circuit components used in the latches and flip-flops and manufacturing tolerances thereof. Latches and flip-flops can be used as memory storage devices, which receive and store the value of a signal during a latching phase (also referred to a set phase) of operation and clear the value from memory during a reset phase of operation. During the latching phase, the signal output is matched to the reference value of a data signal (e.g., high or low) based on a driving voltage, and remains at that value until the reset phase occurs. During the reset phase, the signal output is pulled to one reference value (e.g., low) to clear the memory. A gated latch or flip-flop may further be controlled with a clock or enable signal to enable the latch/flip-flop to progress through the latching and reset phases according to a periodic or controlled pulse to signal the latch/flip-flop when to store a value in memory or reset the memory.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

DESCRIPTION OF EXAMPLE EMBODIMENTS

Overview

Figure 1:
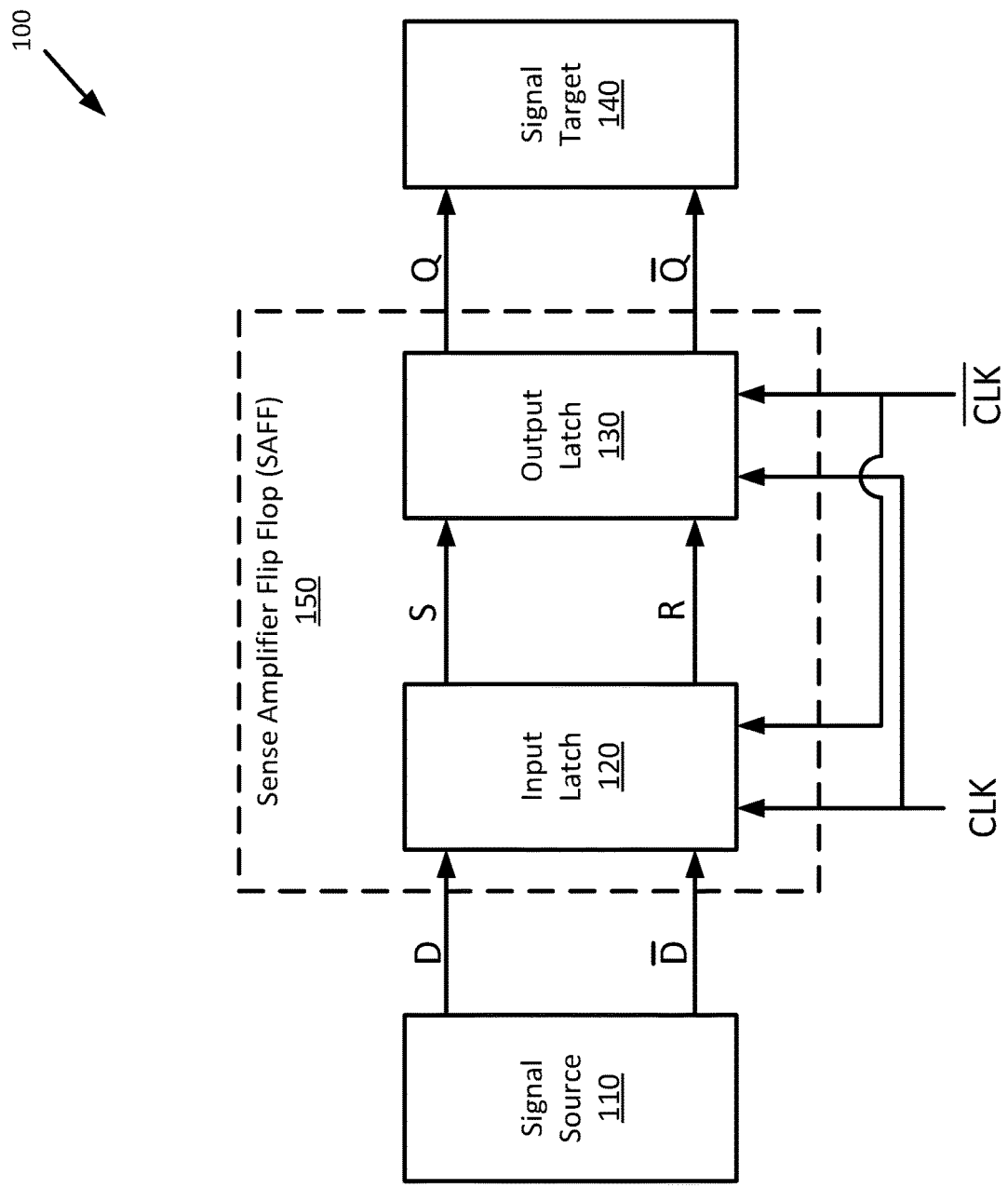
FIG. 1 illustrates a signaling environment using a SAFF, according to embodiments of the present disclosure.

One embodiment presented in this disclosure provides a flip-flop that includes an input latch, configured to receive a data signal and a complement of the data signal and produce a set pulse and a reset pulse based on a clock signal and a difference between the data signal and the complement; and an output latch, configured to store a data value in a first memory and a complement data value in a second memory based on the set pulse, the reset pulse, and the clock signal.

In various embodiments, according to any flip-flop described above or below, the flip-flop further includes a buffer stage disposed between the input latch and the output latch, configured to invert and amplify the set pulse and the reset pulse before the set pulse and the reset pulse are provided to the output latch. In some embodiments, the buffer stage further comprises: a buffer inverter; and a clock-controlled load disposed parallel to the buffer inverter. In some embodiments, the clock-controlled load further comprises: a first feedback transistor having a gate connected to the clock signal, a source connected to an input of the buffer inverter, and a drain connected to an output of the buffer inverter; and a second feedback transistor having a gate connected to a complement of the clock signal, a source connected to the output of the buffer inverter, and a drain connected to the input of the buffer inverter. In some embodiments, the buffer stage includes more than two amplifying buffers.

In various embodiments, according to any flip-flop described above or below, the input latch further includes a first signal arm; a second signal arm; a first difference transistor having a first source connected to the first signal arm, a first drain connected to the second signal arm, and a first gate connected to the clock signal; a second difference transistor having a second source connected to the second signal arm, a second drain connected to the first signal arm, and a second gate connected to a complement of the clock signal; a first regeneration inverter having a first inverter input connected to the first signal arm and a first inverter output connected to the second signal arm; and a second regeneration inverter having a second inverter input connected to the second signal arm and a second inverter output connected to the first signal arm. In some embodiments, the input latch further comprises: a first receiving inverter having an input connected to a data source and an output connected to the first signal arm; and a second receiving inverter having an input connected to a complement of the data source and an output connected to the second signal arm. In some embodiments, the output latch further comprises: a first high latching transistor having a source connected to a driving voltage source and a gate connected to an output of the first signal arm; a first high clock transistor having a source connected to a drain of the first high latching transistor, a drain connected to a first output node, and a gate connected to the complement of the clock signal; a first low clock transistor having a drain connected to the first output node and a gate connected to the clock signal; a first low latching transistor having a drain connected to a source of the first low clock transistor, a gate connected to the output of the first signal arm, and a source connected to ground; a second high latching transistor having a source connected to the driving voltage source and a gate connected to an output of the second signal arm; a second high clock transistor having a source connected to a drain of the second high latching transistor, a drain connected to a second output node, and a gate connected to the complement of the clock signal source; a second low clock transistor having a drain connected to the second output node and a gate connected to the clock signal source; a second low latching transistor having a drain connected to a source of the second low clock transistor, a gate connected to the output of the second signal arm, and a source connected to ground; a third regeneration inverter having a third input connected to the first output node and a third output connected to the second output node; and a fourth regeneration inverter having a fourth input connected to the second output node and a fourth output connected to the first output node.

In various embodiments, according to any flip-flop described above or below, the set pulse and the reset pulse are produced as a result of the input latch being in a low gain, wide bandwidth amplifying state when the clock signal is LOW.

In various embodiments, according to any flip-flop described above or below, the set pulse and the reset pulse are triggered to a regenerative state on a rising edge of the clock signal.

One embodiment of this disclosure provides a device that includes a first signal arm; a second signal arm; a first difference transistor having a first source connected to the first signal arm, a first drain connected to the second signal arm, and a first gate connected to a clock signal source; a second difference transistor having a second source connected to the second signal arm, a second drain connected to the first signal arm, and a second gate connected to a complement of the clock signal source; a first regeneration inverter having a first input connected to the first signal arm and a first output connected to the second signal arm; and a second regeneration inverter having a second input connected to the second signal arm and a second output connected to the first signal arm.

In various embodiments, according to any device described above or below, the device further includes a first high latching transistor having a source connected to a driving voltage source and a gate connected to an output of the first signal arm; a first high clock transistor having a source connected to a drain of the first high latching transistor, a drain connected to a first output node, and a gate connected to the complement of the clock signal source; a first low clock transistor having a drain connected to the first output node and a gate connected to the clock signal source; a first low latching transistor having a drain connected to a source of the first low clock transistor, a gate connected to the output of the first signal arm, and a source connected to ground; a second high latching transistor having a source connected to the driving voltage source and a gate connected to an output of the second signal arm; a second high clock transistor having a source connected to a drain of the second high latching transistor, a drain connected to a second output node, and a gate connected to the complement of the clock signal source; a second low clock transistor having a drain connected to the second output node and a gate connected to the clock signal source; and a second low latching transistor having a drain connected to a source of the second low clock transistor, a gate connected to the output of the second signal arm, and a source connected to ground. In some embodiments, the device further includes a third regeneration inverter having a third input connected to the first output node and a third output connected to the second output node; and a fourth regeneration inverter having a fourth input connected to the second output node and a fourth output connected to the first output node. In some embodiments, the driving voltage source drives the first regeneration inverter, the second regeneration inverter, the third regeneration inverter, and the fourth regeneration inverter.

In various embodiments, according to any device described above or below, the device further includes a first receiving inverter having an input connected to a data source and an output connected to the first signal arm; and a second receiving inverter having an input connected to a complement of the data source and an output connected to the second signal arm.

In various embodiments, according to any device described above or below, the device further includes a first buffer on the first signal arm; a second buffer on the second signal arm; and wherein the first buffer and the second buffer each comprise: a buffer inverter having an input connected to an input node and an output connected to an output node; a first feedback transistor having a source connected to the input node, a gate connected to the clock signal source, and a drain connected to the output node; and a second feedback transistor having a source connected to the output node, a gate connected to the complement of the clock signal source, and a drain connected to the input node. In some embodiments, the device further includes a third buffer on the first signal arm; and a fourth buffer on the second signal arm.

In one embodiment of the present disclosure, a method is provided that includes receiving an actual data signal and a complement data signal that is complementary to the actual data signal; receiving a clock signal; generating a set pulse and a reset pulse based on the actual data signal and the complement data signal and the clock signal, wherein the set pulse and the reset pulse are set based on a difference between the actual data signal and the complement data signal and are pulsed according to a driving voltage in response to detecting an edge of the clock signal; in response to detecting the edge of the clock signal, setting and resetting memory to the set pulse and reset pulse; and outputting values from the memory.

In various embodiments, according to any method described above or below, the difference is between a logical high value and a logical low value carried in the actual data signal and the complement data signal.

In various embodiments, according to any device described above or below, the edge includes a rising edge of the clock signal and a falling edge of a complement of the clock signal.

Example Embodiments

The present disclosure provides an inverter-based architecture for a sense amplifier flip-flop (SAFF) using pseudo-differential inverters that are biased to operate in a class-AB mode to, e.g., provide a more power-efficient output. The SAFF undergoes reset and latching phases according to clock signaling. During the latching phase, the value of the data signal is latched (i.e., stored) in memory. During the reset or tracking phase (also referred to as a pre-amplification phase) the memory is cleared. In some embodiments, the present disclosure provides for a faster transition in the latching phase by using the input latch as a wideband pre-amplifier during the reset phase, and leaving any amplifying buffers active. Doing so means the set and reset signal can sit near half of the supply voltage, thus allowing for a faster reaction and pull up/pull down to the supply rails for the output when the clock cycles. Additionally, the inverter based amplifiers provide a larger signal swing (and thus a higher Signal to Noise Ratio (SNR)) in the output than conventional current-mode logic devices for a given power supply voltage, and allow for dynamic voltage scaling (DVS) for that power supply voltage to account for process variations in fabrication of the components.

Various signals and the values thereof are discussed herein. A digital signal has two steady states, which are referred to herein as high and low, respectively, which may correspond to binary 1/TRUE/HIGH or 0/FALSE/LOW. The complement of a signal carries the opposite state of the actual signal (i.e., is the logical complement of the signal). For example, an actual signal in the high state has a complement signal in the low state, and an actual signal in the low state has a complement signal in the high state.

As used herein, a signal may be designated by a name or a character set with no designation or a designation of 'actual' or 'true' preceding the name (e.g., a clock signal, an actual clock signal, a true clock signal, or CLK) and the complement of that signal may be designated with a bar over the name or character set (e.g., $\overline{CLK}$), a 'B' following the name or character set (e.g., CLKB), or the designation 'complement' or 'not' preceding the name or character set (e.g., the complement clock signal or the not-clock signal). A particular signal and the complement thereof may be collectively referred to by the plural of the particular signal. For example, the 'clock signals' can collectively refer to both the actual clock signal and the complement clock signal and the 'output signals' can collectively refer to both the actual output signal and the complement clock signal.

FIG. 1 illustrates a signaling environment 100 using a SAFF 150, according to embodiments of the present disclosure. A signal source 110 provides a data signal (also referred to a Data, D, an actual data signal, etc.) and a complement data signal (also referred to a DataB, DB, $\overline{DA}$ $\overline{TA}$, $\overline{D}$, etc.). In various embodiments, the signal source 110 may be an optical receiver in a data center receiving optical signals and that are converted into electrical signals D and $\overline{D}$ (e.g., via a photodetector and Transimpedance Amplifier) that are provided to the SAFF 150.

The data signals D and $\overline{D}$ are fed to an input latch 120 of the SAFF 150 to process according to a clock signal (also referred to as CLK) and a complement clock signal (also referred to as $\overline{CLK}$ or CLKB) to produce a Set signal (also referred to as S or as a set pulse) and a Reset signal (also referred to as R or as a reset pulse). An example circuit for an input latch 120 is discussed in greater detail in regard to FIG. 2. In some embodiments, the input latch 120 may produce inverted or complementary versions of S and R (e.g., $\overline{S}$ and $\overline{R}$, respectively), which may be used as-is to produce an inverted output from the SAFF 150 or inverted by an intermediate inverter and/or inverting buffer (not illustrated).

The set and reset signals are provided to an output latch 130 of the SAFF 150 to process according to the clock signal and complement clock signal to produce an output (also referred to as Q) and a complement output (also referred to as $\overline{Q}$). When S is high (and R is low), Q is set to high and $\overline{Q}$ is set to low. Similarly, when S is low (and R is high), Q is set to low and the $\overline{Q}$ is set to high. The clock signal and complement clock signal trigger the output latch 130 to update the values output so that the output signals retain the value of high/low until a next clock signal edge occurs. For example, Q may remain high (and $\overline{Q}$ remain low) until a rising or falling edge in the clock signals is received, at which time the values of Q and $\overline{Q}$ update to reflect the most recent value carried in the data signals.

The outputs Q and $\overline{Q}$ are provided from the SAFF 150 to a signal target 140, which may be various signal processing circuits like clock and data recovery (CDR), equalizers, etc.

Figure 2:
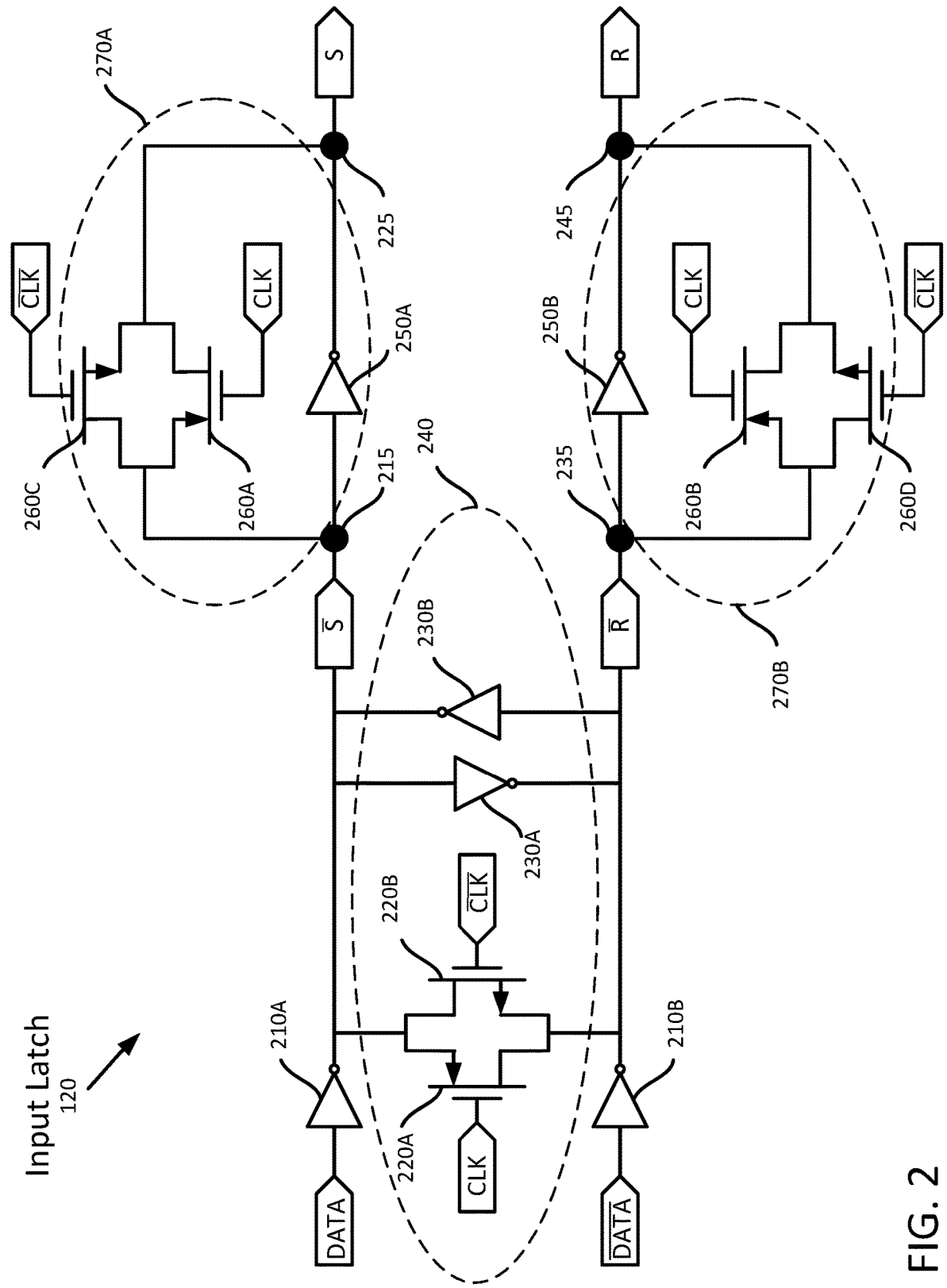
FIG. 2 illustrates an architecture for an input latch of a SAFF, according to embodiments of the present disclosure.

FIG. 2 illustrates an architecture for an input latch 120 of a SAFF 150, according to embodiments of the present disclosure. The input latch 120 includes a first signal arm and a second signal arm that respectively receive the data and complement data signal and output the set and reset pulses.

The first signal arm includes a first receiving inverter 210A (generally, receiving inverter 210) between a data signal input from the signal source 110 and a first node 215. Similarly, the second signal arm includes a second receiving inverter 210B between a complement data input from the signal source 110 and a third node 235. The receiving inverters 210 invert and amplify the value of the received data signals onto the respective nodes (e.g., D is inverted and amplified to $\overline{S}$ on the first node 215 and $\overline{D}$ is inverted and amplified to $\overline{R}$ on the third node 235). This pre-amplification of the data signals helps for a faster phase transition in the SAFF 150 according to the clock signals.

A first difference transistor 220A (generally, difference transistor 220), a second difference transistor 220B, a first regeneration inverter 230A (generally, regeneration inverter 230), and a second regeneration inverter 230B are included between the first node 215 and the third node 235, and may collectively be referred to as a pseudo-differential regenerative comparator 240. The first difference transistor 220A is connected to have a corresponding source connected to the first node 215, a corresponding drain connected to the third node 235, and a corresponding gate connected to a clock signal source to receive the clock signal. The second difference transistor 220B is connected to have a corresponding source connected to the third node 235, a corresponding drain connected to the first node 215, and a corresponding gate connected to a complement clock signal source to receive the complement clock signal. The first regeneration inverter 230A is connected to have a corresponding input connected to the first node 215 and a corresponding output connected to the third node 235, whereas the second regeneration inverter 230B is connected to have a corresponding input connected to the third node 235 and a corresponding output connected to the first node 215.

The operation of the input latch 120 can be broken into two phases of the clock, when CLK is logic HIGH and when CLK is logic LOW. When the clock signal is low, the input latch 120 is in the reset or pre-amplification phase and the output is not valid. The difference transistors 220A and 220B are enabled and $\overline{S}$ and $\overline{R}$ are pulled to half the supply voltage (plus a small fraction of the D and $\overline{D}$ values). As will be appreciated, there is a small difference between $\overline{S}$ and $\overline{R}$, which is a result of the difference in DATA and $\overline{DATA}$ multiplied by the transconductance of the receiving inverters 210A and 210B and multiplied by the impedance at the $\overline{S}$ and $\overline{R}$ nodes. This impedance is mainly set by the difference transistors 220A and 220B, but is also comprised of the input impedance of the first buffer inverter 250A with closed feedback transistors 260A and 260C and second buffer inverter 250B with closed feedback transistors 260B and 260D. This gain from DATA–$\overline{DATA}$ to $\overline{S}$–$\overline{R}$ has a low magnitude but very high/wide bandwidth and is used to track the input difference at a very high rate. Stated differently, the amplification phase (i.e., when CLK is logic LOW) is a low gain, wide bandwidth state for the input latch 120 in which S and R are produced. In this phase, all of the closed switches prevent the regeneration inverters 230A and 230B from regenerating. In the other phase of the clock, when CLK is logic HIGH (e.g., triggered by a rising edge in CLK from logic LOW), all of the transistors 220A, 220B, 260A-D are opened and the input latch 120 is now in the latched or regeneration phase. The impedance at $\overline{S}$ and $\overline{R}$ is now high and the regeneration inverters 230A and 230B amplify the previously generated small difference between $\overline{S}$ and $\overline{R}$ to the full complementary logic levels either HIGH or LOW. In this phase, any change in DATA and $\overline{DATA}$ does not affect $\overline{S}$, $\overline{R}$, Q, or $\overline{Q}$.

The first signal arm and the second signal arm can optionally include one or more inverters and/or amplifying buffers downstream of the first node 215 and the third node 235, respectively. As illustrated, a first amplifying buffer 270A (generally, amplifying buffer 270) is illustrated between the first node 215 and the second node 225 on the first signal arm, and a second amplifying buffer 270B is illustrated between the third node 235 and the fourth node 245. The described buffer arrangement provides for amplification and inversion of the waveforms of $\overline{S}$ and $\overline{R}$ to S and R in coordination with the clock signals, but other arrangements are contemplated (e.g., using a passive resistive load in parallel to an inverter), as is the use of several buffer stages beyond the one stage illustrated (e.g., third and fourth, fifth and sixth, etc., amplifying buffers 270 on the first and second signal arms).

In the illustrated first amplifying buffer 270A, a first buffer inverter 250A (generally, buffer inverter 250) is connected to have a corresponding input connected to the first node 215 and a corresponding output connected to the second node 225. A first feedback transistor 260A (generally, feedback transistor 260) and a third feedback transistor 260C are also connected to the first node 215 and the second node 225. The first feedback transistor 260A has a corresponding source connected to the first node 215, a corresponding drain connected to the second node 225, and a gate connected to a clock signal source, whereas the third feedback transistor 260C has a corresponding source connected to the second node 225, a corresponding drain connected to the first node 215, and a gate connected to a complement of the clock signal source. The feedback transistors 260 thus provide a clock-controlled load for the buffer inverter 250.

In the illustrated second amplifying buffer 270B, a second buffer inverter 250B is connected to have a corresponding input connected to the third node 235 and a corresponding output connected to the fourth node 245. A second feedback transistor 260B and a fourth feedback transistor 260D are also connected to the third node 235 and the fourth node 245. The second feedback transistor 260B has a corresponding source connected to the third node 235, a corresponding drain connected to the fourth node 245, and a gate connected to a clock signal source, whereas the fourth feedback transistor 260D has a corresponding source connected to the fourth node 245, a corresponding drain connected to the third node 235, and a gate connected to a complement of the clock signal source.

In certain embodiments it may not be necessary to use the second amplifying buffer stage 270A/B. In this embodiment the $\overline{S}$ and $\overline{R}$ outputs of the first stage go to the output latch 130.

Figure 3A:
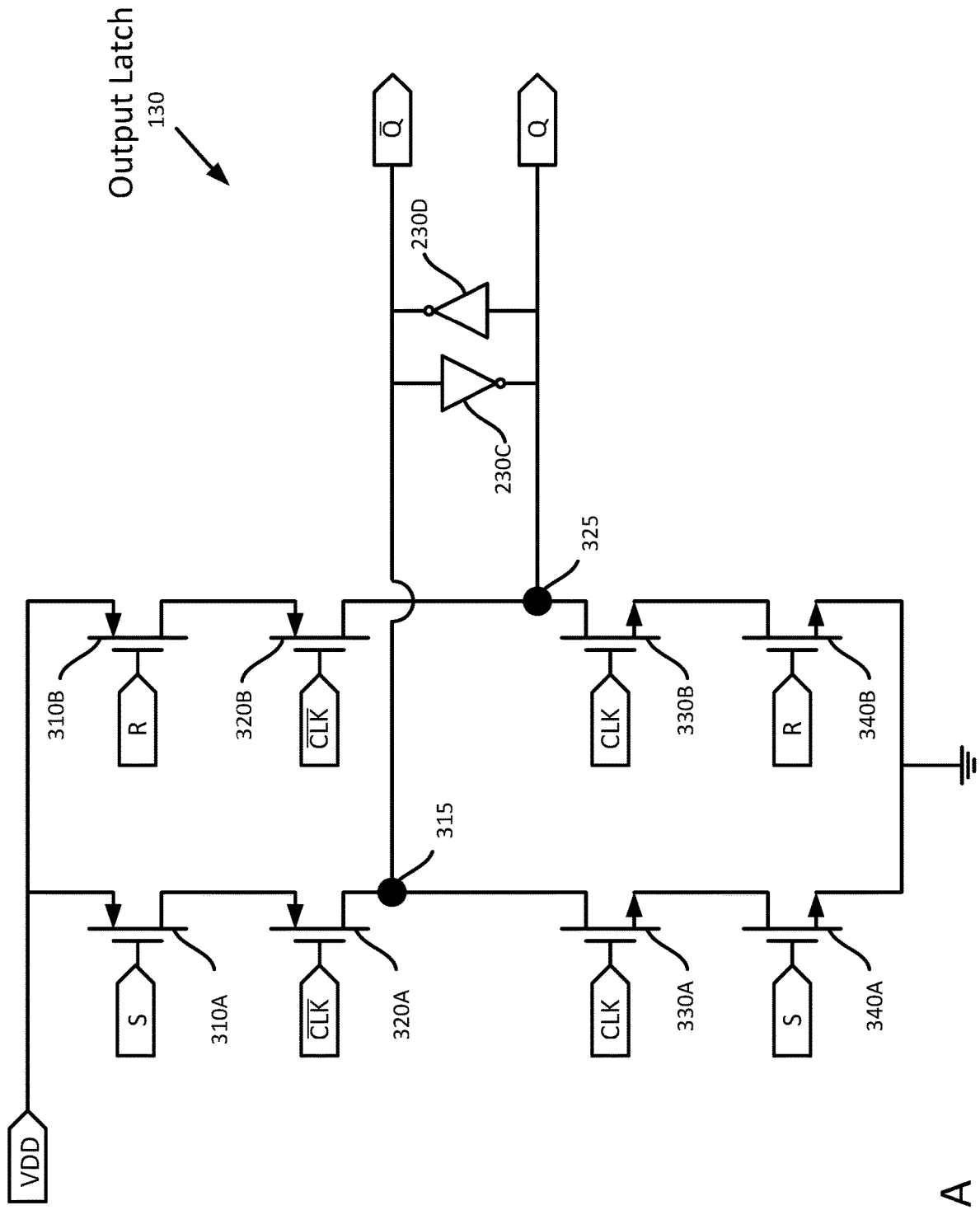
FIGS. 3A and 3B illustrate architectures for an output latch of a SAFF, according to embodiments of the present disclosure.
Figure 3B:
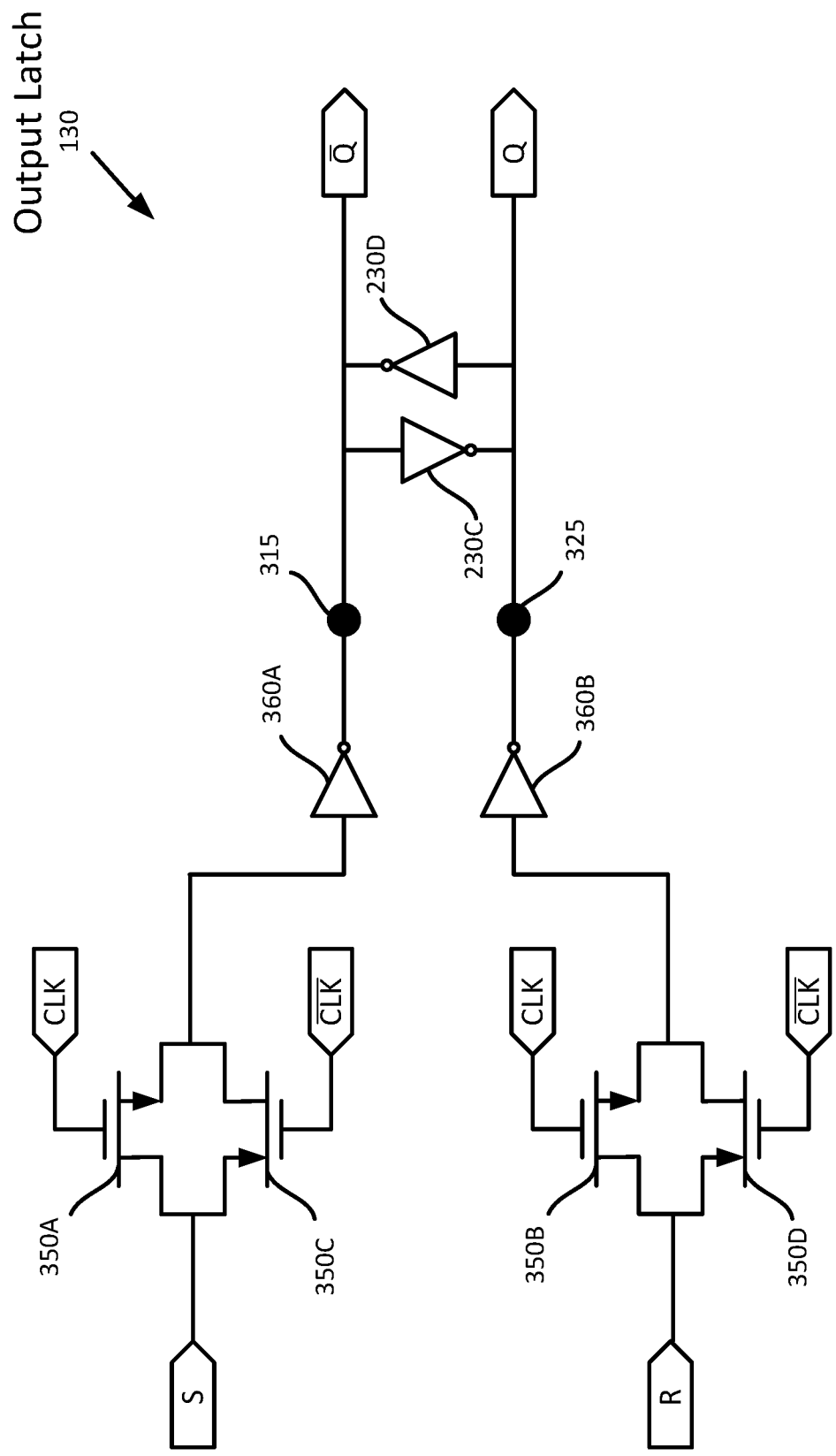

FIGS. 3A and 3B illustrate architectures for an output latch 130 of a SAFF 150, according to embodiments of the present disclosure. The illustrated output latches 130 in FIGS. 3A and 3B are provided as non-limiting examples for purposes of discussion in the present disclosure; the present disclosure contemplates the use of various other architectures in various embodiments.

In FIG. 3A the output latch 130 includes a first memory and a second memory that respectively receive the set signal and the reset signal, to output the output signals (Q and $\overline{Q}$) based on the clock signals on a respective first output node 315 (e.g., Q) and second output node 325 (e.g., $\overline{Q}$). A pair of regeneration inverters 230 are disposed between the first output node 315 and the second output node 325 to cross-link and latch the first memory and the second memory. The third regeneration inverter 230C has a corresponding input connected to the first output node 315 and a corresponding output connected to the second output node 325, while the fourth regeneration inverter 230D has a corresponding input connected to the second output node 325 and a corresponding output connected to the first output node 315.

The first memory includes a first high latching transistor 310A (generally, high latching transistor 310), a first high clock transistor 320A (generally, high clock transistor 320), a first low clock transistor 330A (generally, low clock transistor 330), and a first low latching transistor 340A (generally, low latching transistor 340). The first high latching transistor 310A has a corresponding source connected to a supply voltage source (e.g., $V_{DD}$) and a corresponding gate connected to an output of the first signal arm of the input latch 120 to receive the set signal S. The first high clock transistor 320A has a corresponding source connected to a drain of the first high latching transistor 310A, a corresponding drain connected to a first output node 315, and a corresponding gate connected to the complement of the clock signal source. The first low clock transistor 330A has a corresponding drain connected to the first output node 315 and a corresponding gate connected to the clock signal source. The first low latching transistor 340A has a corresponding drain connected to a source of the first low clock transistor 330A, a corresponding gate connected to the output of the first signal arm to receive the set signal S, and a corresponding source connected to ground.

Similarly, the second memory includes a second high latching transistor 310B, a second high clock transistor 320B, a second low clock transistor 330B, and a second low latching transistor 340B. The second high latching transistor 310B has a corresponding source connected to a driving voltage source (e.g., $V_{DD}$) and a corresponding gate connected to an output of the second signal arm of the input latch 120 to receive the reset signal R. The second high clock transistor 320B has a corresponding source connected to a drain of the second high latching transistor 310B, a corresponding drain connected to a second output node 325, and a corresponding gate connected to the complement of the clock signal source. The second low clock transistor 330B has a corresponding drain connected to the second output node 325 and a corresponding gate connected to the clock signal source. The second low latching transistor 340B has a corresponding drain connected to a source of the second low clock transistor 330B, a corresponding gate connected to the output of the second signal arm to receive the reset signal R, and a corresponding source connected to ground.

In FIG. 3B the output latch 130 includes a first memory and a second memory that respectively receive the set signal and the reset signal, to output the output signals (Q and $\overline{Q}$) based on the clock signals. A pair of regeneration inverters 230 are disposed between the first output node 315 and the second output node 325 to cross-link and latch the first memory and the second memory. The third regeneration inverter 230C has a corresponding input connected to the first output node 315 and a corresponding output connected to the second output node 325, while the fourth regeneration inverter 230D has a corresponding input connected to the second output node 325 and a corresponding output connected to the first output node 315.

The first memory includes a first latching transistor 350A (generally, latching transistor 350) controlled by the clock signal (CLK), and a third latching transistor 350C controlled by the complementary clock signal ($\overline{CLK}$) on the respective gates. The first latching transistor 350A receives the set signal (S) on a respective drain and the third latching transistor 350C receives the set signal (S) on a respective source. The first memory provides an output, from the source of the first latching transistor 350A and the drain of the third latching transistor 350C that feeds to a first output inverter 360A (generally, output inverter 360) to provide the signal to the first output node 315.

Similarly, the second memory includes a second latching transistor 350B controlled by the clock signal (CLK), and a fourth latching transistor 350D controlled by the complementary clock signal ($\overline{CLK}$) on the respective gates. The second latching transistor 350B receives the reset signal (R) on a respective drain and the fourth latching transistor 350D receives the reset signal (R) on a respective source. The second memory provides an output, from the source of the second latching transistor 350B and the drain of the fourth latching transistor 350D that feeds to a second output inverter 360B to provide the signal to the second output node 325.

Figure 4:
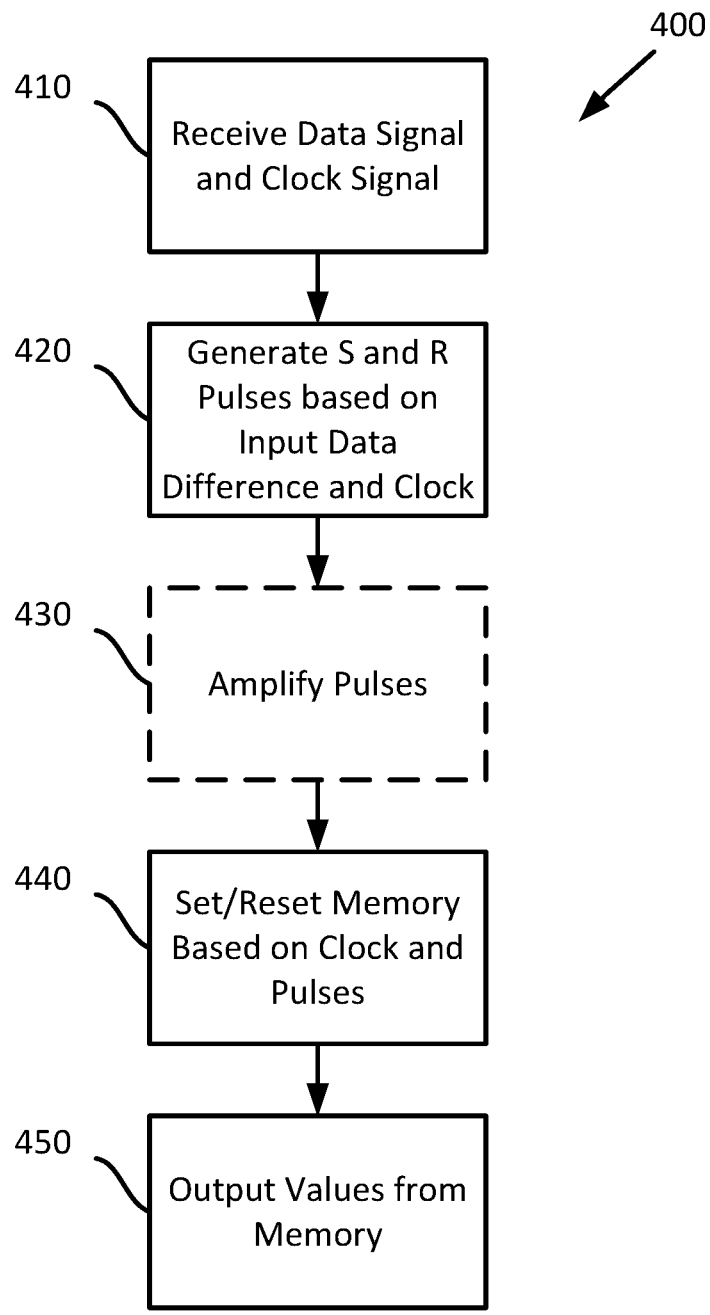
FIG. 4 is a flowchart of a method of operation of a SAFF, according to embodiments of the present disclosure.

FIG. 4 is a flowchart of a method 400 of operation of a SAFF 150, according to embodiments of the present disclosure. The SAFF 150 is a sequential logic device, and therefore elements of method 400 may be performed substantially simultaneously by different components of the SAFF 150 to produce the output signals based on the data signals and the clock used to control the gates of various transistors within the SAFF 150.

Method 400 begins at block 410, where the SAFF 150 receives an actual data signal (D) and a complement data signal ($\overline{D}$) at separate signal arms of an input latch 120. In various embodiments, the data signals are received, inverted and amplified by receiving inverters 210 on the respective signal arms. The SAFF 150 also receives a clock signal (CLK) and the complement of the clock signal ($\overline{CLK}$) at block 410. The clock signals are used to control the gates of difference transistors 220, feedback transistors 260, high clock transistors 320, and low clock transistors 330 in the SAFF 150. Depending on the layout and conductivity types (e.g., NMOS vs PMOS) of the transistors, the clock signals may trigger the pulses of the set and reset signals (S and R) output by the input latch 120, and whether the set and reset signals latch or clear the memories in the output latch 130 on an edge of the clock signal. As will be appreciated, as both the actual clock signal and the complement clock signal are used in the SAFF 150, the rising edge of the actual clock signal corresponds to the falling edge of the complement clock signal, and vice versa. Accordingly, the SAFF 150 may use either the rising edge or the falling edge of the clock signal to trigger pulse generation for the set and reset signals.

At block 420, the input latch 120 of the SAFF 150 generates the set and reset signals (S and R, or $\overline{S}$ and $\overline{R}$) as either a difference between the data signals at time instants based on the clock signals. In various embodiments, the set and reset signals are provided as a pseudo-difference, with a value proportional to the input data and riding on a common mode level that is approximately halfway between logical high and logical low. When DATA is high, the reset signal (R) is low and the set signal (S) is high, and when DATA is low the reset signal is high and the set signal is low. States in which the set and reset signals are both high or low at the same time are invalid.

At block 430, amplifying buffers 270 (if included) amplify and/or invert the values of the set and reset signals generated by the input latch 120. The amplifying buffers 270 may also be controlled according to the clock signals so that the set and reset signals are amplified when the clock signal pulse is received, and not amplified at other times.

At block 440, the output latch 130 of the SAFF 150 receives the set and reset signals from the input latch 120 and, based on the clock signals, sets or resets the memories in the output latch 130 accordingly. Stated differently, the output latch 130 stores a data value in a first memory, and a complement data value in a second memory based on the values carried by the set and reset signals.

At block 450, the values stored in the memories of the output latch 130 are output as output signals Q and $\overline{Q}$. The output latch 130 continues to output these values until the next clock cycle, at which time the values may remain the same or change based on the values carried in the data signals. Because the set and reset signals vary from the pseudo-differential state to the high state or to the low state, rather than from the high state to the low state (or vice versa), the reaction time of the output signals to the clock edges is faster, and smoother (i.e., more consistent to the reference values for high/low) are produced. Accordingly, the SNR of the output signals is improved relative to other architectures.

Method 400 may continue for as long as the data signals and clock signals are provided.

Figure 5:
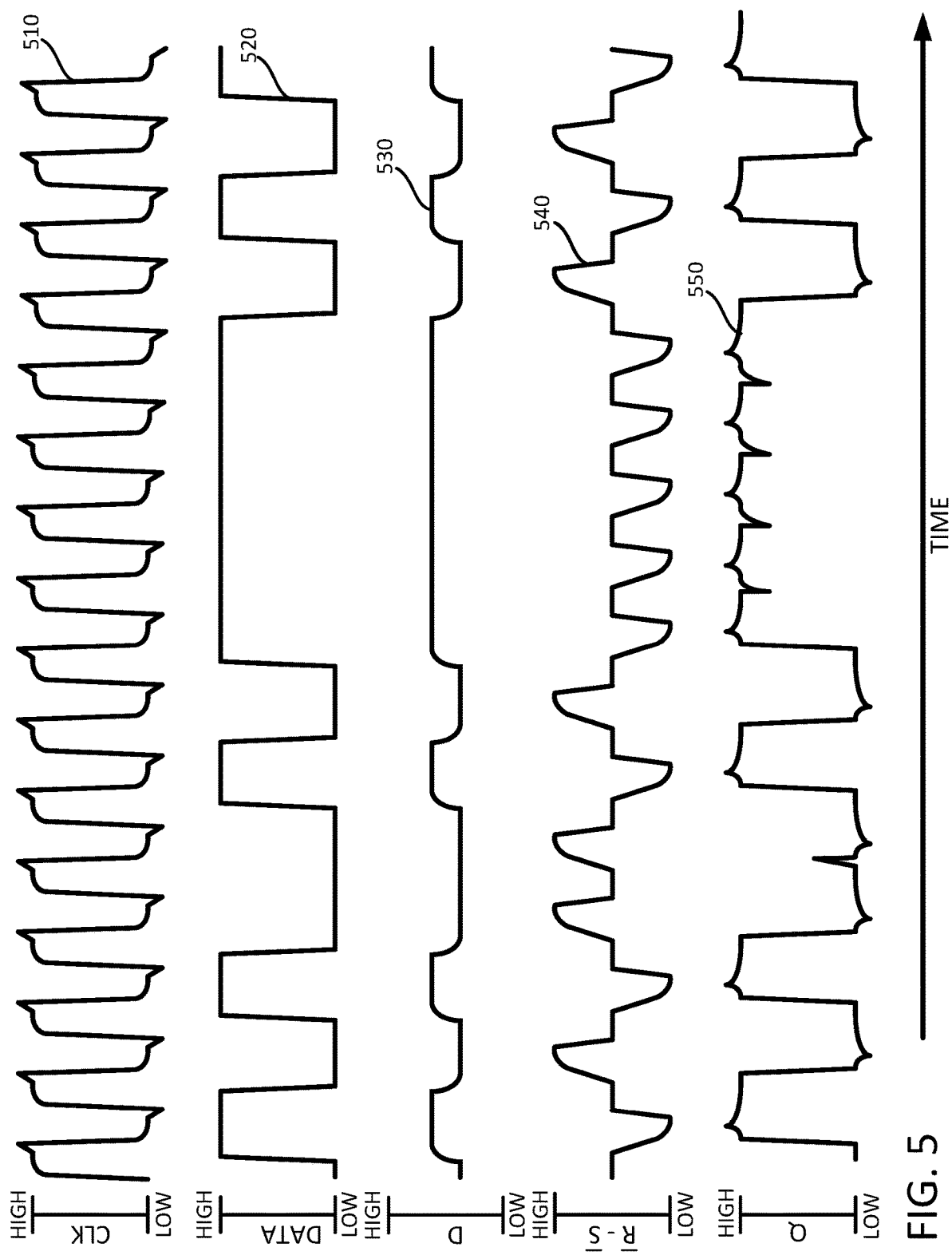
FIG. 5 illustrates waveforms for the signals processed according to a SAFF, according to embodiments of the present disclosure To facilitate understanding, identical reference numerals have been used, where possible, to designate identical elements that are common to the figures. It is contemplated that elements disclosed in one embodiment may be beneficially used in other embodiments without specific recitation.

FIG. 5 illustrates waveforms for the signals processed according to a SAFF 150, according to embodiments of the present disclosure. An idealized clock waveform 510 (corresponding to a clock signal or a complement clock signal) is illustrated in each of FIG. 5, with a regular period between high and low values. Additionally, an idealized data waveform 520 (corresponding to a data signal or a complement data signal) is illustrated in FIG. 5, with a square wave delineating the a general sequence of ones and zeroes (e.g., 10100111110101 with 1 representing high and 0 representing low and reading the waveforms from right to left). Although the idealized clock waveform 510 and the idealized data waveform 520 are illustrated as square waveforms, other types of waveforms (e.g., sawtooth) are also envisioned by the present disclosure. In most cases the actual data received at D and $\overline{D}$ at the input of the SAFF is far from a square wave pattern due to the limited bandwidth of the channel that is presenting the data. The primary purpose of the SAFF is to reconstruct the low amplitude and distorted input to a square pattern.

FIG. 5 illustrates an ideal clock waveform 510 and ideal data waveform 520. The ideal data is attenuated and smoothed out by a lossy channel and shown as the real data input 530 into the SAFF. The goal of the SAFF is to restore the signal to close to the original data. This differential input signal is converted to the differential $\overline{S}$–$\overline{R}$ signal 540 which moves to the high or low value pulse based on the value carried in the input in response to clock (e.g., clock waveform 510), but otherwise remains at an intermediate value between high and low values during the low portion of clock cycle. This $\overline{S}$–$\overline{R}$ signal 540 is then fed to the output latch to create the output waveform 550 that reconstructs the data.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function (s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A flip-flop, comprising:
   an input latch, configured to receive a data signal and a complement of the data signal and produce a set pulse and a reset pulse based on a clock signal and a difference between the data signal and the complement of the data signal;
   an output latch, configured to store a data value in a first memory and a complement data value in a second memory based on the set pulse, the reset pulse, and the clock signal; and
   a buffer stage disposed between the input latch and the output latch, configured to invert and amplify the set pulse and the reset pulse before the set pulse and the reset pulse are provided to the output latch, wherein the buffer stage further comprises:
      a buffer inverter; and
      a clock-controlled load disposed parallel to the buffer inverter.

2. The flip-flop of claim 1, wherein the clock-controlled load further comprises:
   a first feedback transistor having a gate connected to the clock signal, a source connected to an input of the buffer inverter, and a drain connected to an output of the buffer inverter; and
   a second feedback transistor having a gate connected to a complement of the clock signal, a source connected to the output of the buffer inverter, and a drain connected to the input of the buffer inverter.

3. The flip-flop of claim 1, wherein the input latch further comprises:
   a first signal arm;
   a second signal arm;
   a first difference transistor having a first source connected to the first signal arm, a first drain connected to the second signal arm, and a first gate connected to the clock signal;
   a second difference transistor having a second source connected to the second signal arm, a second drain connected to the first signal arm, and a second gate connected to a complement of the clock signal;
   a first regeneration inverter having a first inverter input connected to the first signal arm and a first inverter output connected to the second signal arm; and
   a second regeneration inverter having a second inverter input connected to the second signal arm and a second inverter output connected to the first signal arm.

4. The flip-flop of claim 3, wherein the input latch further comprises:
   a first receiving inverter having an input connected to a data source and an output connected to the first signal arm; and
   a second receiving inverter having an input connected to a complement of the data source and an output connected to the second signal arm.

5. The flip-flop of claim 3, wherein the output latch further comprises:
   a first high latching transistor having a source connected to a driving voltage source and a gate connected to an output of the first signal arm;
   a first high clock transistor having a source connected to a drain of the first high latching transistor, a drain connected to a first output node, and a gate connected to the complement of the clock signal;
   a first low clock transistor having a drain connected to the first output node and a gate connected to the clock signal;
   a first low latching transistor having a drain connected to a source of the first low clock transistor, a gate connected to the output of the first signal arm, and a source connected to ground;
   a second high latching transistor having a source connected to the driving voltage source and a gate connected to an output of the second signal arm;
   a second high clock transistor having a source connected to a drain of the second high latching transistor, a drain connected to a second output node, and a gate connected to the complement of the clock signal;
   a second low clock transistor having a drain connected to the second output node and a gate connected to the clock signal;
   a second low latching transistor having a drain connected to a source of the second low clock transistor, a gate connected to the output of the second signal arm, and a source connected to ground;
   a third regeneration inverter having a third input connected to the first output node and a third output connected to the second output node; and
   a fourth regeneration inverter having a fourth input connected to the second output node and a fourth output connected to the first output node.

6. The flip-flop of claim 1, wherein the set pulse and the reset pulse are produced as a result of the input latch being in a low gain, wide bandwidth amplification phase when the clock signal is LOW.

7. The flip-flop of claim 1, wherein the set pulse and the reset pulse are triggered to a regeneration phase on a rising edge of the clock signal.

8. A device, comprising:
   a first signal arm;

a second signal arm;
a first difference transistor having a first source connected to the first signal arm, a first drain connected to the second signal arm, and a first gate connected to a clock signal source;
a second difference transistor having a second source connected to the second signal arm, a second drain connected to the first signal arm, and a second gate connected to a complement of the clock signal source;
a first regeneration inverter having a first input connected to the first signal arm and a first output connected to the second signal arm; and
a second regeneration inverter having a second input connected to the second signal arm and a second output connected to the first signal arm.

9. The device of claim 8, further comprising:
a first high latching transistor having a source connected to a driving voltage source and a gate connected to an output of the first signal arm;
a first high clock transistor having a source connected to a drain of the first high latching transistor, a drain connected to a first output node, and a gate connected to the complement of the clock signal source;
a first low clock transistor having a drain connected to the first output node and a gate connected to the clock signal source;
a first low latching transistor having a drain connected to a source of the first low clock transistor, a gate connected to the output of the first signal arm, and a source connected to ground;
a second high latching transistor having a source connected to the driving voltage source and a gate connected to an output of the second signal arm;
a second high clock transistor having a source connected to a drain of the second high latching transistor, a drain connected to a second output node, and a gate connected to the complement of the clock signal source;
a second low clock transistor having a drain connected to the second output node and a gate connected to the clock signal source; and
a second low latching transistor having a drain connected to a source of the second low clock transistor, a gate connected to the output of the second signal arm, and a source connected to ground.

10. The device of claim 9, further comprising:
a third regeneration inverter having a third input connected to the first output node and a third output connected to the second output node; and
a fourth regeneration inverter having a fourth input connected to the second output node and a fourth output connected to the first output node.

11. The device of claim 10, wherein the driving voltage source drives the first regeneration inverter, the second regeneration inverter, the third regeneration inverter, and the fourth regeneration inverter.

12. The device of claim 8, further comprising:
a first receiving inverter having an input connected to a data source and an output connected to the first signal arm; and
a second receiving inverter having an input connected to a complement of the data source and an output connected to the second signal arm.

13. The device of claim 8, further comprising:
a first buffer on the first signal arm;
a second buffer on the second signal arm; and
wherein the first buffer and the second buffer each comprise:
a buffer inverter having an input connected to an input node and an output connected to an output node;
a first feedback transistor having a source connected to the input node, a gate connected to the clock signal source, and a drain connected to the output node; and
a second feedback transistor having a source connected to the output node, a gate connected to the complement of the clock signal source, and a drain connected to the input node.

14. The device of claim 13, further comprising:
a third buffer on the first signal arm; and
a fourth buffer on the second signal arm.

15. A method, comprising:
receiving an actual data signal and a complement data signal that is complementary to the actual data signal;
receiving a clock signal;
determining a difference between the actual data signal and the complement data signal via a first difference transistor having a first source configured to receive the actual data signal, a first drain connected to the complement data signal, and a first gate configured to receive the clock signal, and via a second difference transistor having a second source configured to receive complement data signal, a second drain configured to receive the actual data signal, and a second gate connected to receive a complement of the clock signal;
generating a set pulse and a reset pulse based on the actual data signal and the complement data signal and the clock signal, wherein the set pulse and the reset pulse are set based on the difference and are pulsed according to a driving voltage in response to detecting an edge of the clock signal;
in response to detecting the edge of the clock signal, setting and resetting memory to the set pulse and the reset pulse; and
outputting values from the memory.

16. The method of claim 15, wherein the difference is between a logical high value and a logical low value carried in the actual data signal and the complement data signal.

17. The method of claim 15, wherein the edge includes a rising edge of the clock signal and a falling edge of a complement of the clock signal.

* * * * *